United States Patent
Gentry et al.

(10) Patent No.: US 11,670,358 B2
(45) Date of Patent: *Jun. 6, 2023

(54) MEMORY WITH ADJUSTABLE TSV DELAY

(71) Applicant: Micron Technology, Inc., Boise, ID (US)

(72) Inventors: John H. Gentry, Boise, ID (US); Michael J. Scott, Boise, ID (US); Greg S. Gatlin, Mountain Home, ID (US); Lael H. Matthews, Meridian, ID (US); Anthony M. Geidl, Boise, ID (US); Michael Roth, Boise, ID (US); Markus H. Geiger, Boise, ID (US); Dale H. Hiscock, Boise, ID (US); Evan C. Pearson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/496,728

(22) Filed: Oct. 7, 2021

(65) Prior Publication Data

US 2022/0028443 A1    Jan. 27, 2022

Related U.S. Application Data

(63) Continuation of application No. 16/706,548, filed on Dec. 6, 2019, now Pat. No. 11,145,352.

(51) Int. Cl.
*G11C 7/00* (2006.01)
*G11C 11/4076* (2006.01)
*H01L 25/065* (2023.01)

(52) U.S. Cl.
CPC ...... *G11C 11/4076* (2013.01); *H01L 25/0657* (2013.01); *H01L 2225/06541* (2013.01)

(58) Field of Classification Search
CPC .............................................. H01L 2225/06541
USPC ............................................................ 365/194
See application file for complete search history.

(56) References Cited

U.S. PATENT DOCUMENTS

| | | | |
|---|---|---|---|
| 11,145,352 B2 * | 10/2021 | Gentry | G11C 5/063 |
| 2014/0188409 A1 | 7/2014 | Cordero et al. | |
| 2019/0279963 A1 | 9/2019 | Woo et al. | |
| 2019/0303042 A1 | 10/2019 | Kim et al. | |
| 2019/0304512 A1 * | 10/2019 | Narui | G11C 7/1066 |
| 2021/0174859 A1 | 6/2021 | Gentry et al. | |

* cited by examiner

*Primary Examiner* — Hoai V Ho
(74) *Attorney, Agent, or Firm* — Perkins Coie LLP

(57) ABSTRACT

Memory devices and systems with adjustable through-silicon via (TSV) delay, and associated methods, are disclosed herein. In one embodiment, an apparatus includes a plurality of memory dies and a TSV configured to transmit signals to or receive signals from the plurality of memory dies. The apparatus further includes circuitry coupled to the TSV and configured to introduce propagation delay onto signals transmitted to or received from the TSV. In some embodiments, the apparatus includes additional circuitry configured to activate, deactivate, adjust at least a portion of the circuitry, or any combination thereof, to alter the propagation delay. In this manner, the apparatus can align internal timings of memory dies of the plurality of memory dies.

20 Claims, 3 Drawing Sheets

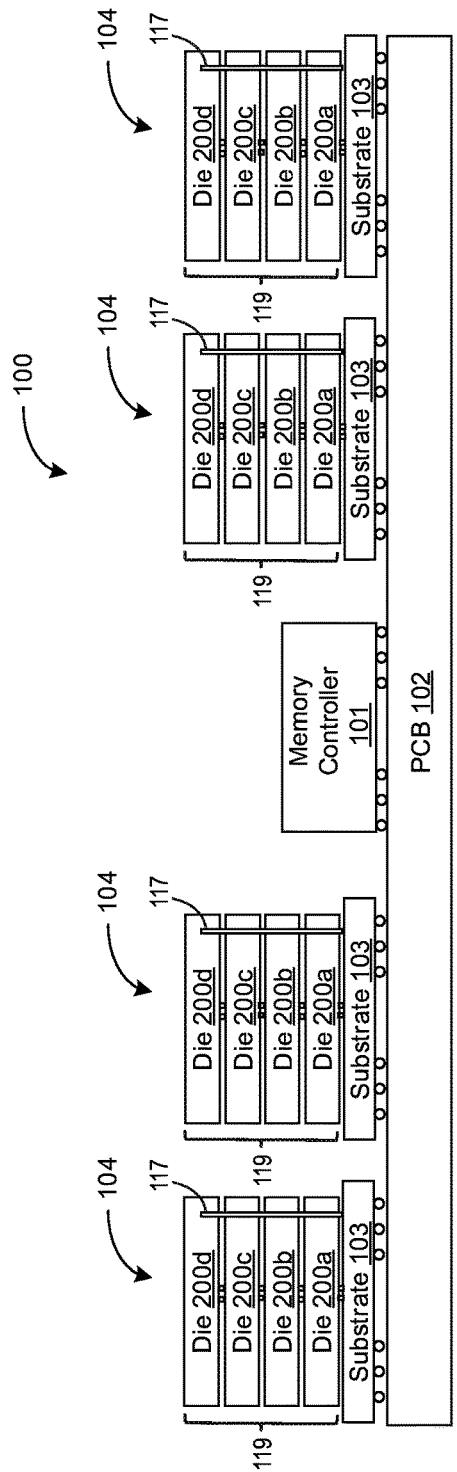
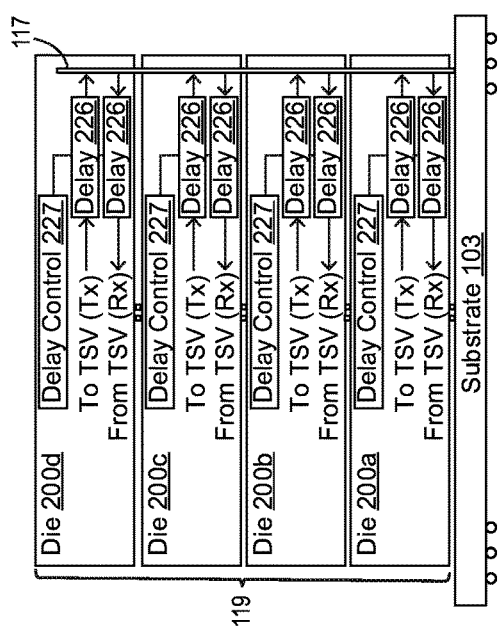
Fig. 1A
Fig. 1B

MEMORY WITH ADJUSTABLE TSV DELAY

CROSS-REFERENCE TO RELATED APPLICATION(S)

This application is a continuation of U.S. patent application Ser. No. 16/706,548, filed Dec. 6, 2019, which is incorporated herein by reference in its entirety.

TECHNICAL FIELD

The present disclosure is related to memory systems, devices, and associated methods. In particular, the present disclosure is related to memory devices with adjustable through-silicon via (TSV) delay.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIG. 1A is a block diagram schematically illustrating a memory system configured in accordance with various embodiments of the present technology.

FIG. 1B is a block diagram schematically illustrating a memory device configured in accordance with various embodiments of the present technology.

DETAILED DESCRIPTION

Figure 2:
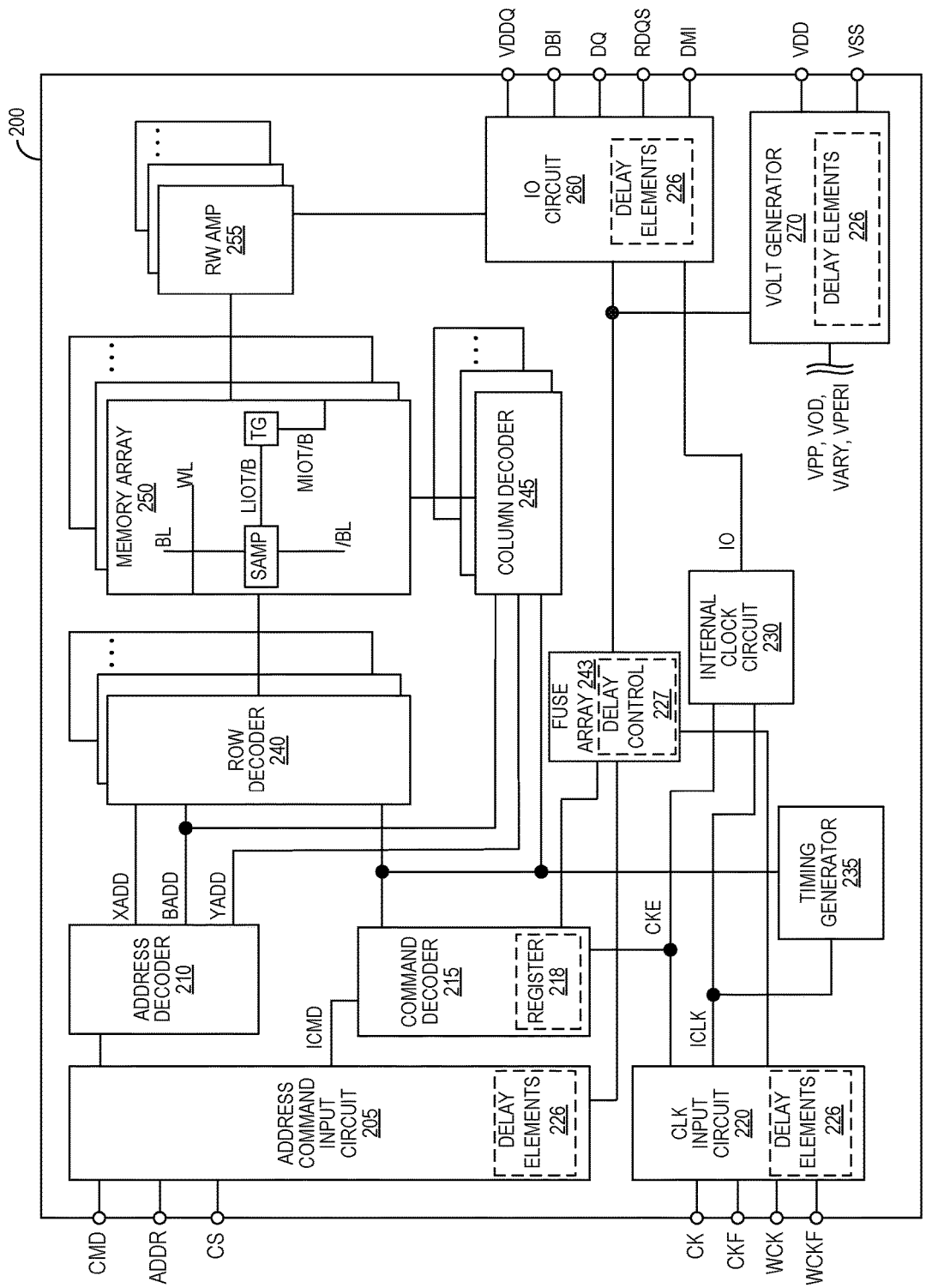
FIG. 2 is a block diagram schematically illustrating a memory die configured in accordance with various embodiments of the present technology.

Memory dies often have differing drive strengths. A memory device is sometimes built with memory dies having the same or nearly the same drive strengths. This ensures that internal timings to/from/within the memory dies are consistent across the memory device. More often, however, there is often a lack of control during manufacturing over which specific memory die are included in a memory device, and ensuring that all memory dies in a memory device have similar drive strengths has proven technically difficult and cost prohibitive. Therefore, memory devices are often inherently built with memory dies having differing drive strengths. As a result, internal timings in communications to/from/within different memory dies of a memory device can differ. This can be problematic in devices that include multiple memory dies where the same signal is sent to/from/within two or more of the dies, such as in memory devices that use a master memory die to relay signals to slave memory dies in a three-dimensional stack (3DS). In particular, performance and/or functionality of the memory device may worsen as the difference(s) between the internal timings of two or more of the memory dies increases.

Conventionally, when a memory die of a memory device and/or 3DS requires different timings relative to other memory dies within that device or 3DS, internal periphery or array timings of the memory device are adjusted to compensate for the different timings required. Adjusting the memory device in this manner, however, can lead to a variety of undesirable and/or unforeseen complications due to unwanted (and unknown) timing outcomes.

Accordingly, as discussed in greater detail below, the technology disclosed herein relates to memory systems and devices with adjustable through-silicon via (TSV) delay. In some embodiments, memory systems and devices disclosed herein include delay elements electrically coupled to a TSV in electrical communication with two or more memory dies (e.g., of a 3DS). The delay elements can be activated, deactivated, and/or adjusted via test modes and/or fuse options to adjust the timing of a TSV and/or a memory die relative to other TSVs and/or memory dies of a memory device without the undesirable and unforeseen complications of changing the internal periphery or array timings of the memory device. As the delay elements of the memory dies are activated, deactivated, and/or adjusted to compensate for differing drive strengths of the memory dies, the internal timings of the memory dies are made consistent across the memory device, which can increase the performance and functionality of the memory device.

A person skilled in the art will understand that the technology may have additional embodiments and that the technology may be practiced without several of the details of the embodiments described below with reference to FIGS. 1-4. In the illustrated embodiments below, the memory devices and systems are primarily described in the context of memory dies arranged in a 3DS and communicatively coupled using TSVs. Memory devices and systems configured in accordance with other embodiments of the present technology, however, can include other three-dimensional stack arrangements (e.g., memory dies communicatively coupled using wire bonds, direct chip attachments, and/or other stacking technologies) and/or can include other arrangements of memory dies (e.g., non-3DS arrangements of memory dies). Therefore, memory devices and systems of other embodiments can include other adjustable signaling delay elements configured to adjust the timing of other communication technologies (e.g., wire bonds, direct chip attachments, etc.) in addition to or in lieu of adjustable TSV delay elements.

Furthermore, in the illustrated embodiments below, the memory device and systems are primarily described in the context of devices incorporating devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

FIG. 1A is a block diagram schematically illustrating a memory system 100 configured in accordance with various embodiments of the present technology. The memory system 100 can include a memory controller 101 (e.g., a field programming gate array (FPGA) or other suitable memory controller) and one or more memory devices 104 (e.g., one or more dynamic random-access memory (DRAM) devices) electrically connected to the memory controller 101 via a printed circuit board (PCB) 102 (e.g., via one or more electrical contacts and/or traces). The memory controller 101 can be configured to control one or more operations of the memory system 100.

Individual memory devices 104 of the memory system 100 can include a package substrate 103 and one or more memory dies 200. As illustrated in FIG. 1A, each of the memory devices 104 includes a plurality of memory dies 200 (labeled individually as first through fourth memory dies 200a-200d). The first memory die 200a of each memory device 104 is attached to the package substrate 103, and the second through fourth memory dies 200b-200d are stacked on top of the first memory die 200a to form a three-dimensional stack (3DS) 119. In some embodiments, the first through fourth memory dies 200a-200d are each electrically connected to the package substrate 103 (e.g., via one or more electrical contacts and/or traces), which in turn can be electrically connected to the PCB 102. For example, the first memory die 200a can be electrically connected to the package substrate 103 via solder bumps or other electrical contacts (e.g., bond pads, wire bonds, die attach adhesives, etc.) formed between the first memory die 200a and the package substrate 103. In these and other embodiments, the first memory die 200a and/or the second through fourth memory dies 200b-200d can be electrically connected to the package substrate 103 via one or more through-silicon vias (TSVs) 117. The TSVs 117 can extend through one or more of the memory dies 200a-200d and/or through the package substrate 103. In these and still other embodiments, the second through fourth memory dies 200b-200d can be electrically connected to the package substrate 103 via other electrical connections, such as bond pads, wire bonds, etc.

The memory system 100 can be connected to any one of a number of electronic devices that is capable of utilizing memory for the temporary or persistent storage of information, or a component thereof. For example, the memory system 100 can be operably connected to a host device (not shown). The host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to the memory system 100, although, in other embodiments, the host device may be indirectly connected to the memory system 100 (e.g., over a networked connection or through intermediary devices).

FIG. 1B is a block diagram schematically illustrating a memory device 104 of FIG. 1A. As shown, each of the memory dies 200a-200d in the 3DS 119 includes delay elements 226 and delay control circuitry 227. In some embodiments, the delay elements 226 are circuits configured to introduce delay to signals sent to and received from the TSV 117. For example, the delay elements 226 can include gate delays (e.g., latches, inverters, etc.). In these and other embodiments, the delay elements 226 can include resistor/capacitor (RC) delays. In operation, the delay elements 226 are configured to introduce propagation delay (e.g., time delay) onto signals transmitted to and/or received from the TSV 117.

As discussed in greater detail below, the delay control circuitry 227 of each memory die 200 is configured to activate, deactivate, and/or adjust the delay elements 226 of the memory die 200. For example, if the internal timing of a TSV 117 of a memory die 200 is faster relative to the internal timings of the other TSVs of the memory dies 200 in the 3DS 119 and/or in the memory system 100, the delay control circuitry 227 can activate and/or adjust one or more of the delay elements 226 of the memory die 200 to introduce propagation delay onto signals transmitted to and/or received from the TSV 117. In these and other embodiments, if the internal timing of a TSV 117 of a memory die 200 is slower relative to the internal timings of the other TSVs of the memory dies 200 in the 3DS 119 and/or in the memory system 100, the delay control circuitry 227 can deactivate and/or adjust one or more of the delay elements 226 of the memory die 200 to remove propagation delay from signals transmitted to and/or received from the TSV 117. In this manner, the internal timings of the memory dies 200 can be adjusted such that the internal timings of the memory dies 200 across the 3DS 119 and/or the memory system 100 can be aligned and/or made consistent despite the varying drive strengths of the memory dies 200.

Although the devices 104 illustrated in FIGS. 1A and 1B are each illustrated with four memory dies 200a-200d, one or more memory devices 104 configured in accordance with other embodiments of the present technology can include a greater or lesser number of memory dies 200 (e.g., one memory die, two memory dies, three memory dies, or more than four memory dies) than illustrated. In these and other embodiments, the orientation of the memory dies 200 included in a memory device 104 can vary. For example, the first through fourth memory dies 200a-200d illustrated in FIGS. 1A and 1B are each oriented face down (e.g., toward the package substrate 103) in a back-to-face orientation. In other embodiments, any one or more of the first through fourth memory dies 200a-200d can be oriented face up (e.g., away from the package substrate 103) such that two or more of the memory dies 200a-200d are arranged in a face-to-back, face-to-face, and/or back-to-back orientation on a package substrate 103. In these and still other embodiments, any two or more of the first through fourth memory dies 200a-200d can be arranged side-by-side on the package substrate 103, as opposed to in the stacked arrangement illustrated in FIGS. 1A and 1B.

Furthermore, while each of the memory dies 200a-200d of the memory device 104 are illustrated in FIG. 1B as including two delay elements 226 and delay control circuitry 227, all or a subset of the memory dies 200a-200d can lack delay elements 226 and/or delay control circuitry 227 in other embodiments. Additionally, or alternatively, memory dies 200 configured in accordance with other embodiments can include a different number of delay elements 226 per TSV than shown. For example, a memory die 200 can include a first number (e.g., zero, one, two, three, etc.) of delay elements 226 configured to introduce propagation delay onto signals transmitted to the TSV 117 and a second number (e.g., zero, one, two, three, etc.) of delay elements 226 configured to introduce propagation delay onto signals received from the TSV 117. In still other embodiments, the delay elements 226 and/or the control circuitry 227 can be positioned at other locations on the memory device 104 and/or on the memory system 100, such as on the controller 101, on the PCB 102, and/or on a package substrate 103.

In these and still other embodiments, one or more TSVs of a memory die 200 and/or one or more of the memory dies 200 of a memory device 104 and/or a memory system 100 can share delay elements 226 and/or delay control circuitry 227. For example, data TSVs of the memory device 104 can share delay elements 226 and/or delay control circuitry 227, command TSVs can share delay elements 226 and/or delay control circuitry 227, and/or address TSVs can share delay elements 226 and/or delay control circuitry 227. As another example, the first memory die 200a of a memory device 104 can be a master memory die and the second through fourth memory dies 200b-200d can be slave memory dies. In these embodiments, external commands and other signals (e.g., clock, command, address, and/or data signals) are sent to and/or received from the memory dies 200b-200d via the first memory die 200a. For example, a clock signal can be transmitted to the first memory die 200a via the package substrate 103, and the first memory die 200a can redistribute the clock signal to the remaining memory dies 200b-200d of the memory device 104. Thus, the delay elements 226 and the delay control circuitry 227 of the first (master) memory die 200a are shared with the second through fourth (slave) memory dies 200b-200d such that activating and/or adjusting delay elements 226 of the first memory die 200a introduces and/or adjusts propagation delay on each of the memory dies 200a-200d.

FIG. 2 is a block diagram schematically illustrating a memory device 200 (e.g., a memory die 200, such as a first, second, third, and/or fourth memory die 200a-200d of FIGS. 1A and 1B) configured in accordance with various embodiments of the present technology. The memory die 200 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, and power supply terminals VDD, VSS, and VDDQ.

The power supply terminals of the memory die 200 may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in sense amplifiers included in the memory array 250 of the memory die 200, and the internal potential VPERI can be used in many other circuit blocks.

The power supply terminals may also be supplied with power supply potential VDDQ. The power supply potential VDDQ can be supplied to the IO circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 260 so that power supply noise generated by the IO circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a CKE signal from a command decoder 215, an input buffer can receive the CK and CKF signals and the WCK and WCKF signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable signal CKE from the command decoder 215. For example, the internal clock circuit 230 can include a clock path (not shown in FIG. 2) that receives the internal clock signal ICLK and provides various clock signals to the command decoder 215. The internal clock circuit 230 can further provide input/output (TO) clock signals. The IO clock signals can be supplied to an input/output (TO) circuit 260 and can be used as a timing signal for determining an output timing of read data and the input timing of write data. The IO clock signals can be provided at multiple clock frequencies so that data can be output from and input into the memory die 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated that can be used by the command decoder 215, the column decoder 245, and/or other components of the memory die 200.

The memory die 200 may include an array of memory cells, such as memory array 250. The memory cells of the memory array 250 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be a one or more memory banks or another arrangement of memory cells. In these and other embodiments, the memory regions of the memory array 250 can be arranged in one or more groups (e.g., groups of memory banks, one or more logical memory ranks or dies, etc.). Memory cells in the memory array 250 can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The command terminals and address terminals may be supplied with an address signal and a bank address signal from outside the memory die 200. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal (BADD) and supply the bank address signal to both the row decoder 240 and the column decoder 245.

The command and address terminals can be supplied with command signals CMD, address signals ADDR, and chip selection signals CS (e.g., from the memory controller 101 and/or a host device). The command signals may represent various memory commands (e.g., including access commands, which can include read commands and write commands). The select signal CS may be used to select the memory device 104 and/or the memory die 200 to respond to commands and addresses provided to the command and address terminals. When an active CS signal is provided to the memory die 200, the commands and addresses can be decoded and memory operations can be performed. The command signals CMD may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 215. The command decoder 215 may further include one or more registers 218 for tracking various counts or values.

When a read command is issued, and a row address and a column address are timely supplied with the read command, read data can be read from memory cells in the memory array 250 designated by the row address and the column address. The read command may be received by the command decoder 215, which can provide internal commands to the IO circuit 260 so that read data can be output from the data terminals DQ, RDQS, DBI, and DMI via read/write (RW) amplifiers 255 and the IO circuit 260 according to the RDQS clock signals. The read data may be provided at a time defined by read latency information RL that can be programmed in the memory die 200, for example in a mode register (not shown in FIG. 2). The read latency information RL can be defined in terms of clock cycles of the CK clock signal. For example, the read latency information RL can be a number of clock cycles of the CK signal after the read command is received by the memory die 200 when the associated read data is provided.

When a write command is issued, and a row address and a column address are timely supplied with the command, write data can be supplied to the data terminals DQ, DBI, and DMI over DQ lines connected to the memory die 200 according to the WCK and WCKF clock signals. The write command may be received by the command decoder 215, which can provide internal commands to the IO circuit 260 so that the write data can be received by data receivers in the IO circuit 260, and supplied via the IO circuit 260 and the RW amplifiers 255 to the memory array 250 over IO lines of the memory die 200. The write data may be written in the memory cell designated by the row address and the column address. The write data may be provided to the data terminals at a time that is defined by write latency WL information. The write latency WL information can be programmed in the memory die 200, for example, in the mode register (not shown in FIG. 2). The write latency WL information can be defined in terms of clock cycles of the CK clock signal. For example, the write latency information WL can be a number of clock cycles of the CK signal after the write command is received by the memory die 200 when the associated write data is received.

The memory array 250 may be refreshed or maintained to prevent data loss, either due to charge leakage or imprint effects. A refresh operation, may be initiated by the memory die 200, by the memory system 100 (e.g., by the memory controller 101 of FIG. 1), and/or by a host device, and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory die 200 may be configured to refresh the same row of memory cells in every memory bank of the memory array 250 simultaneously. In another approach, the memory die 200 may be configured to refresh the same row of memory cells in every memory bank of the memory array 250 sequentially. In still another approach, the memory die 200 can further include circuitry (e.g., one or more registers, latches, embedded memories, counters, etc.) configured to track row (e.g., word line) addresses, each corresponding to one of the memory banks in the memory array 250. In this approach, the memory die 200 is not constrained to refresh the same row in each memory bank of the memory array 250 before refreshing another row in one of the memory banks.

Regardless of the refresh approach, the memory die 200 can be configured to refresh memory cells in the memory array 250 within a given refresh rate or time window (e.g., 32 ms, 28 ms, 25 ms, 23 ms, 21 ms, 18 ms, 16 ms, 8 ms, etc.), known as tREF. In these embodiments, the memory device 104 and/or the memory system 100 can be configured to supply refresh commands to the memory die 200 in accordance with a specified minimum cadence tREFI. For example, the memory device 104 and/or the memory system 100 can be configured to supply one or more refresh commands to the memory die 200 at least every 7.8 µs such that an approximate minimum of 4000 refresh commands are supplied to the memory die 200 within a 32 ms time window.

As shown in FIG. 2, the command/address input circuit 205, the clock input circuit 220, the IO circuit 260, and/or the internal voltage generator circuit 270 can include delay elements 226. In some embodiments, the memory die 200 includes one or more delay elements 226 per TSV 117 (FIGS. 1A and 1B). For example, for each TSV 117 of the memory die 200, the memory die 200 can include one or more delay elements 226 configured to introduce propagation delay onto signals received from a TSV 117 and/or one or more delay elements 226 configured to introduce propagation delay onto signals transmitted to a TSV 117. In other embodiments, the memory die 200 can include one or more delay elements 226 shared amongst TSVs 117. For example, the memory die 200 can include one or more delay elements 226 shared amongst TSVs 117 corresponding to the DQ terminals of the memory die, one or more delay elements 226 shared amongst TSVs 117 corresponding to the command pins of the memory die 200, one or more delay elements 226 shared amongst TSVs 117 corresponding to the clock pins of the memory die 200, one or more delay elements 226 shared amongst TSV's 117 corresponding to the address pins of the memory die 200, and/or one or more delay elements 226 shared amongst other groupings of similar TSV's 117.

The memory device 200 (e.g., an individual memory die 200 and/or a memory device 104 having one or more memory dies 200) can include a fuse array 243 having delay control circuitry 227. The fuse array 243 and/or the delay control circuitry 227 can include antifuse elements. An antifuse element is an element which is insulated in an initial state and, when subjected to a dielectric breakdown by a connect operation, makes a transition to a conductive state. When the transition to the conductive state is made by the connect operation, the antifuse element cannot be returned to the insulated state. Therefore, the antifuse element can be used as a nonvolatile and irreversible storage element, and may be programmed using conventional antifuse programming circuits. Additionally, or alternatively, the delay control circuitry 227 can be one or more circuits independent of the fuse array 243 and/or operable during test modes of the memory die 200.

As shown in FIG. 2, the delay control circuitry 227 is in communication with one or more delay elements 226 of the memory die 200. Using the delay control circuitry 227 of the fuse array 243, the propagation delay of signals sent to and/or received from terminals of the memory die 200 (e.g., sent to and/or received from a TSV 117 or group of TSVs) can be adjusted to account for the drive strength of the memory die 200. For example, antifuse elements of the delay control circuitry 227 in the fuse array 243 can be transitioned to their insulated states to activate, deactivate, and/or adjust various delay elements 226 of the memory die 200. Additionally, or alternatively, the delay elements 226 can be activated, deactivated, and/or adjusted during test modes of the memory die 200 and/or memory device 104 (e.g., using vendor specific/restricted commands). In turn, the internal timings of the memory die 200 can adjusted (e.g., to align with other memory dies 200 of a memory device 104 and/or a memory system 100).

Figure 3:
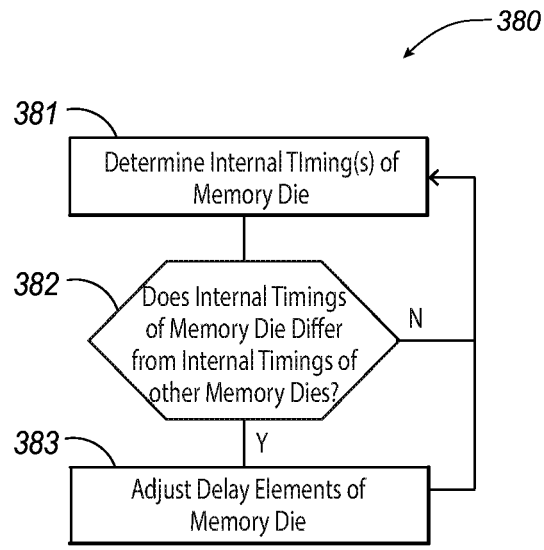
FIG. 3 is a flow diagram illustrating a drive strength compensation routine of a memory device configured in accordance with various embodiments of the present technology.

FIG. 3 is a flow diagram illustrating a drive strength compensation routine 380 of a memory device configured in accordance with various embodiments of the present technology. In some embodiments, the routine 380 can be executed, at least in part, by the memory device, a memory controller operably connected to the memory device, and/or a host device operably connected to the memory controller and/or to the memory device. For example, the routine 380 can be carried out by delay control circuitry, antifuse elements of a fuse array, delay elements of a command/address input circuit, delay elements of a clock input circuit, delay elements of an IO circuit, and/or delay elements of a voltage generator. In these and other embodiments, all or a subset of the steps of the routine 380 can be performed by other components of the memory device (e.g., a command decoder), by components of the memory controller, by components of the host device, and/or by other components of a memory system containing the memory device.

The routine 380 begins at block 381 by determining one or more internal timings of a memory die. In some embodiments, the routine 380 determines the internal timings of the memory die by determining the drive strength of the memory die. In these and other embodiments, the routine 380 enters a test mode of the memory die to determine the internal timings of the memory die. In these and other embodiments, the routine 380 determines internal timings of a memory die in response to a command (e.g., a vendor specific or restricted command), and/or the routine 380 determines the internal timings of a memory die automatically (e.g., upon power-up of the memory die; after initial installation of a memory die in a memory device; periodically after an elapsed amount of time, boot cycles, processed commands, etc.; and/or in response to other events). In these and other embodiments, the routine 380 determines the internal timings of an individual TSV and/or a group of TSVs (e.g., a group of similar TSVs) of the memory die. For example, the routine 380 can measure the internal timings of signals sent to and/or received from the TSV or group of TSVs.

At block 352, the routine 380 determines whether the internal timings of the memory die determined at block 381 differ from corresponding internal timings of other memory dies in a memory device and/or memory system. In some embodiments, the routine 380 determines whether the internal timings of the memory die differ by comparing the internal timings to a desired internal timing value and/or range of values. In some embodiments, the desired internal timing value and/or range of values corresponds to the TSV and/or group of TSVs under test. In these and other embodiments, the routine 380 determines whether the internal timings of the memory die differ by comparing the internal timings to one or more measured internal timings of the other memory dies. For example, the routine 380 can compare the internal timings determined at block 381 to the internal timings of the same TSV and/or group of TSVs on the other memory dies in the memory device and/or to the internal timings of a similar TSV or group of TSVs on the other memory dies in the memory system.

If the routine 380 determines that the internal timings of the memory die differ from the drive strength(s) of other memory dies in the memory device and/or memory system, the routine 380 proceeds to block 383 to adjust the delay elements of the memory die. Otherwise, the routine 380 returns to block 381 to determine the internal timings of the same memory die (e.g., of another TSV or group of TSVs of the same memory die) and/or to determine the internal timings of another memory die of the memory device and/or memory system.

At block 383, the routine 380 adjusts the delay elements of the memory die. The adjusted delay elements correspond to the TSV or group of TSVs from which the routine 380 determined the drive strength at block 381. In some embodiments, the routine 380 can activate, deactivate, and/or adjust the delay elements by transitioning one or more antifuse elements of delay control circuitry in a fuse array of the memory die/device to an insulated state. In these and other embodiments, the routine 380 can activate, deactivate, and/or adjust the delay elements using one or more test modes of the memory die/device (e.g., using vendor specific or restricted commands and/or delay control circuitry).

In the event that the internal timings (e.g., the drive strength) of the TSV or group of TSVs of the memory die determined at block 381 is greater (e.g., is faster) than the corresponding internal timings (e.g., drive strengths) of the other memory die and/or the desired internal timing value(s), the routine 380 can activate and/or adjust one or more of the corresponding delay elements of the memory die to increase propagation delay introduced onto signals sent to and/or received from the TSV and/or group of TSVs. In this manner, the internal timings of the memory die over the TSV or group of TSVs can be slowed to align with the internal timings of the other memory die of the memory device and/or memory system. On the other hand, in the event that the internal timings (e.g., the drive strengths) over the TSV or group of TSVs of the memory die determined at block 381 is lesser (e.g., is slower) than the corresponding internal timings (e.g., drive strengths) of the other memory dies and/or the desired internal timing value(s), the routine 380 can deactivate and/or adjust one or more of the corresponding delay elements of the memory die to decrease propagation delay introduced onto signals sent to and/or received from the TSV and/or group of TSVs. For example, one or more of the corresponding delay elements in some embodiments can be activated by default and/or can be previously activated such that propagation delay is introduced onto signals sent to and/or received from the TSV and/or group of TSVs by default or as a result of the previous activation. In these and other embodiments, the routine 380 can deactivate (e.g., bypass, turn off, etc.) and/or adjust one or more of the activated delay elements to decrease the propagation delay introduced onto the signals sent to/received from the TSV and/or group of TSVs. In this manner, the internal timings of the memory die over the TSV or group of TSVs can be quickened to align with the internal timings of the other memory dies of the memory device and/or memory system. In some embodiments, the routine 380 can return to block 381 to determine the internal timing of the same memory die (e.g., of the same or another TSV or group of TSVs of the same memory die) and/or to determine the drive strength of another memory die of the memory device and/or memory system.

Although the steps of the routine 380 are discussed and illustrated in a particular order, the method illustrated by the routine 380 in FIG. 3 is not so limited. In other embodiments, the method can be performed in a different order. In these and other embodiments, any of the steps of the routine 380 can be performed before, during, and/or after any of the other steps of the routine 380. Moreover, a person of ordinary skill in the relevant art will readily recognize that the illustrated method can be altered and still remain within these and other embodiments of the present technology. For example, one or more steps of the routine 380 illustrated in FIG. 3 can be omitted and/or repeated in some embodiments.

Figure 4:
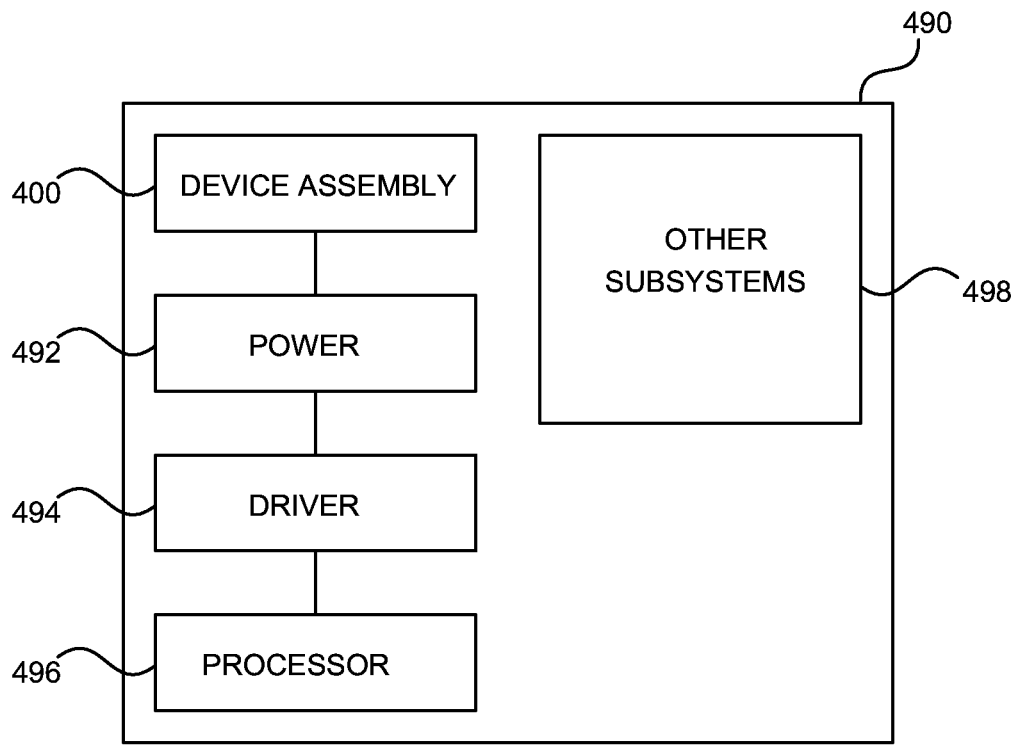
FIG. 4 is a schematic view of a system that includes a memory device configured in accordance with various embodiments of the present technology.

FIG. 4 is a schematic view of a system that includes a memory device in accordance with embodiments of the present technology. Any one of the foregoing memory devices described above with reference to FIGS. 1-3 can be incorporated into any of a myriad of larger and/or more complex systems, a representative example of which is system 490 shown schematically in FIG. 4. The system 490 can include a semiconductor device assembly 400, a power source 492, a driver 494, a processor 496, and/or other subsystems and components 498. The semiconductor device assembly 400 can include features generally similar to those of the memory device described above with reference to FIGS. 1-3, and can, therefore, include various features of memory content authentication. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, vehicles, appliances, and other products. Components of the system 490 may be housed in a single unit or distributed over multiple, interconnected units (e.g., through a communications network). The components of the system 490 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory die, comprising:
   first circuitry coupled to a through-silicon via (TSV) that is configured to transmit signals to or receive signals from the memory die, the first circuitry configured to introduce propagation delay onto first signals transmitted to or received from the TSV at only the memory die; and
   second circuitry configured, based at least in part on internal timings of second signals transmitted to or received from the TSV at another memory die, to adjust the propagation delay by activating the first circuitry, deactivating the first circuitry, or adjusting the first circuitry.

2. The memory die of claim 1, further comprising a command/address input circuit configured to transmit the first signals to or receive the first signals from the TSV.

3. The memory die of claim 1, further comprising an input/output circuit configured to transmit the first signals to or receive the first signals from the TSV.

4. The memory die of claim 1, further comprising a clock input circuit configured to receive the first signals from the TSV.

5. The memory die of claim 1, further comprising a voltage generator circuit configured to receive the first signals from the TSV.

6. The memory die of claim 1, wherein the first circuitry comprises one or more gate delay elements, one or more resistors, one or more capacitors, or any combination thereof.

7. The memory die of claim 1, further comprising a fuse array, wherein the second circuitry is configured, using the fuse array, to activate the first circuitry, deactivate the first circuitry, or adjust the first circuitry.

8. The memory die of claim 1, wherein:
   the first circuitry is configured to introduce first propagation delay onto the first signals transmitted to the TSV at only the memory die;
   the second circuitry is configured to adjust the first propagation delay by activating the first circuitry, deactivating the first circuitry, or adjusting the first circuitry; and
   the memory die further comprises third circuitry configured to introduce second propagation delay onto second signals received from the TSV at only the memory die.

9. The memory die of claim 8, wherein the second circuitry is further configured, to adjust the second propagation delay, to activate the second circuitry, deactivate the second circuitry, or adjust the second circuitry.

10. The memory die of claim 1, wherein:
    the TSV is a first TSV;
    the first circuitry is further coupled to a second TSV that is configured to transmit third signals to or receive third signals from the memory die; and
    the first circuitry is further configured to introduce second propagation delay onto the third signals transmitted to or received from the TSV at only the memory die.

11. The memory die of claim 1, wherein the memory die comprises at least a portion of the TSV.

12. A memory device assembly, comprising:
    a first memory die;
    a second memory die; and
    a through-silicon via (TSV) configured to transmit signals to or receive signals from each of the first and second memory dies,
    wherein the first memory die includes (a) first circuitry coupled to the TSV and configured to introduce first propagation delay onto first signals transmitted to or received from the TSV at only the first memory die, and (b) second circuitry configured, based at least in part on internal timings of second signals transmitted to or received from the TSV at the second memory die, to alter the first propagation delay by activating the first circuitry, deactivating the first circuitry, or adjusting the first circuitry, and
    wherein the second memory die includes (a) third circuitry coupled to the TSV and configured to introduce second propagation delay onto third signals transmitted to or received from the TSV at only the second memory die, and (b) fourth circuitry configured, based at least in part on internal timings of fourth signals transmitted to or received from the TSV at the first memory die, to alter the second propagation delay by activating the third circuitry, deactivating the third circuitry, or adjusting the third circuitry.

13. The memory device assembly of claim 12, wherein:
    the first circuitry comprises one or more first gate delay elements, one or more first resistors, one or more first capacitors, or any first combination thereof; or
    the third circuitry comprises one or more second gate delay elements, one or more second resistors, one or more second capacitors, or any second combination thereof.

14. The memory device assembly of claim 12, further comprising a fuse array, wherein:
    the second circuitry is configured, using the fuse array, to activate the first circuitry, deactivate the first circuitry, or adjust the first circuitry; or
    the fourth circuitry is configured, using the fuse array, to activate the third circuitry, deactivate the third circuitry, or adjust the third circuitry.

15. The memory device assembly of claim 12, wherein:
    the first memory die further includes a first fuse array;
    the second circuitry is configured, using the first fuse array, to activate the first circuitry, deactivate the first circuitry, or adjust the first circuitry;
    the second memory die further includes a second fuse array; and
    the fourth circuitry is configured, using the second fuse array, to activate the third circuitry, deactivate the third circuitry, or adjust the third circuitry.

16. The memory device assembly of claim 12, wherein:
    the first circuitry is configured to introduce the first propagation delay onto the first signals transmitted to the TSV at only the first memory die;

the second circuitry is configured to adjust the first propagation delay by activating the first circuitry, deactivating the first circuitry, or adjusting the first circuitry;

the first memory die further includes fifth circuitry configured to introduce third propagation delay onto fifth signals received from the TSV at only the first memory die; and the second circuitry is configured to adjust the third propagation delay by activating the fifth circuitry, deactivating the fifth circuitry, or adjusting the fifth circuitry.

17. The memory device assembly of claim 12, wherein:

the TSV is a first TSV;

the memory device assembly further comprises a second TSV configured to transmit fifth signals to or receive fifth signals from each of the first and second memory dies; and the first circuitry is further coupled to the second TSV to introduce third propagation delay onto the fifth signals transmitted to or received from the TSV at only the first memory die.

18. The memory device assembly of claim 12, wherein:

the first memory die further includes a first command/address input circuit configured to transmit the first signals to or receive the first signals from the TSV; and the second memory die further includes a second command/address input circuit configured to transmit the third signals to or receive the third signals from the TSV.

19. The memory device assembly of claim 12, wherein:

the first memory die further includes a first input/output circuit configured to transmit the first signals to or receive the first signals from the TSV; and the second memory die further includes a second input/output input circuit configured to transmit the third signals to or receive the third signals from the TSV.

20. The memory device assembly of claim 12, wherein:

the first memory die further includes a first clock input circuit configured to receive the first signals from the TSV; and the second memory die further includes a second clock input circuit configured to receive the third signals from the TSV.

* * * * *